United States Patent
Karp et al.

(10) Patent No.: US 9,831,218 B1
(45) Date of Patent: Nov. 28, 2017

(54) WAFER TO WAFER STACKING

(71) Applicant: Xilinx, Inc., San Jose, CA (US)

(72) Inventors: James Karp, Saratoga, CA (US);
Michael J. Hart, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/480,258

(22) Filed: Apr. 5, 2017

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/06513* (2013.01)

(58) Field of Classification Search
CPC ............. H01L 25/0657; H01L 257/777; H01L 25/043; H01L 25/074; H01L 25/0756; H01L 25/117; H01L 25/50
See application file for complete search history.

(56) References Cited

U.S. PATENT DOCUMENTS

| 2003/0134453 A1 | 7/2003 | Prabhu et al. |
| 2006/0079019 A1 | 4/2006 | Kim |
| 2012/0002392 A1* | 1/2012 | Karp ........................ H01L 23/60 361/820 |

* cited by examiner

*Primary Examiner* — Walter H Swanson
(74) *Attorney, Agent, or Firm* — Keith Taboada

(57) ABSTRACT

Embodiments herein describe techniques for wafer to wafer stacking of integrated circuit chips (e.g., dice) to form stacked IC devices. In one example, a stacked IC device is provided that includes a first wafer, a second wafer, and first conductive bridge. The second wafer is stacked on and secured to the first wafer. The second wafer has a plurality of IC dice that are communicatively coupled to a plurality of IC dice formed on the first wafer. The first conductive bridge has a first end that is sandwiched between the first and second wafers. The first conductive bridge shorts exposed pads of dice formed in the exclusion zones of the first and second wafers.

8 Claims, 6 Drawing Sheets

WAFER TO WAFER STACKING

TECHNICAL FIELD

Examples of the present disclosure generally relate to integrated circuit (IC) chip packaging, in particular, to wafer to wafer stacking of IC chips to form stacked IC devices.

BACKGROUND

One technique for forming stacked integrated circuit (IC) device is stacking a first wafer having a plurality of IC dice on a second wafer having a plurality of IC dice. The stacked wafers are cut to separate the stacked IC devices, wherein the stacked IC devices includes at least one die from the dice formed on each wafer.

During the stacking process, electrostatic discharge (ESD) between the wafers will often damage one of more of the dice, thereby reducing the stacked IC device yield. In order to mitigate ESD, ionized air is typically utilized to discharge the wafers before stacking. However, ionized air often does not completely remove the charge from the wafer, and often concentrates the charge in isolated regions of the wafer, so when the wafers are stacked, the EDS from these isolated regions having concentrated charge actually increases the number of damaged dice. Since the damage occurs late in the fabrication process, the cost due to the damaged dice and consequently the reduced stacked IC device yield is undesirably high.

Therefore, there is a need for improved techniques for wafer to wafer stacking of integrated circuit chips (e.g., dice) to form stacked IC devices.

SUMMARY

Embodiments herein describe techniques for wafer to wafer stacking of integrated circuit chips (e.g., dice) to form stacked IC devices. In one embodiment, a stacked integrated circuit (IC) device is provided that includes a first wafer, a second wafer, and a conductive bridge. The second wafer is stacked on and secured to the first wafer. The second wafer has a plurality of IC dice that are communicatively coupled to a plurality of IC dice formed on the first wafer. The conductive bridge has a first end that is sandwiched between the first and second wafers. The first conductive bridge has a second end that extends laterally beyond the first and second wafers which can be coupled to a ground for grounding the wafers during stacking.

In another example, a stacked IC device includes a first wafer, a second wafer, and a conductive bridge. The second wafer is stacked on and secured to the first wafer. The first wafer has a first plurality of integrated circuit (IC) dice disposed inward of an exclusion zone located at an edge of the first wafer and a second plurality of IC dice disposed within the exclusion zone. The second wafer has a first plurality of IC dice disposed inward of an exclusion zone of the second wafer and a second plurality of IC dice disposed within the exclusion zone of the second wafer. The first plurality of IC dice formed on the second wafer are communicatively coupled with the first plurality of IC dice formed on the first wafer. The conductive bridge is disposed in the exclusion zone and sandwiched between the first and second wafers. The conductive bridge shorts a plurality of first contact pads of at least a first IC die of the second plurality of IC dice disposed within the exclusion zone of the first wafer and shorts a plurality of first contact pads of at least a first IC die of the second plurality of IC dice disposed within the exclusion zone of the second wafer.

In another example, a method for forming a stacked IC device is provided that includes (a) shorting a plurality of first contact pads of a first IC die of a plurality of IC dice disposed on a first wafer, the first IC die disposed within an exclusion zone of the first wafer; (b) contacting a second wafer having a plurality of IC dice to the first conductive bridge while stacking the second wafer on the first wafer; and (c) electrically connecting a second IC die of the plurality of IC dice formed on the first wafer with a second IC die the plurality of IC dice formed on the second wafer. The second IC die on each of the first and second wafers formed inward of the exclusion zones.

In another example, a method for forming a stacked IC device is provided that includes (a) shorting a plurality of first contact pads of a first IC die of a plurality of IC dice disposed on a first wafer with a first conductive bridge, the first IC die disposed within an exclusion zone of the first wafer; (b) shorting a plurality of first contact pads of a first IC die of a plurality of IC dice disposed on a second wafer with the first conductive bridge while stacking the first wafer and the second wafer, the first IC die of the second wafer disposed within an exclusion zone of the second wafer; (c) electrically connecting dice of the plurality of IC dice formed on the first wafer inward of the exclusion zone with dice of the plurality of IC dice formed on the second wafer inward of the exclusion zone; and (d) cutting the stacked first and second wafers to separate a first stacked IC device from a plurality of stacked IC devices, the first stacked IC device having at least one die from the dice formed on the first wafer inward of the exclusion zone and at least one die from the dice formed on the second wafer inward of the exclusion zone.

In another example, a method for forming a stacked integrated circuit (IC) device. The method includes coupling a first conductive bridge to a first wafer having a plurality of integrated circuit (IC) dice, grounding the first conductive bridge, contacting a second wafer having a plurality of IC dice to the first conductive bridge, stacking the second wafer on the first wafer, and electrically connecting the plurality of IC dice formed on the first wafer with the plurality of IC dice formed on the second wafer.

In yet another example, a method for forming a stacked integrated circuit (IC) device is provided that includes contacting, with a second wafer, a plurality of grounded conductive bridges extending beyond an exclusion region of a first wafer, electrically connecting a plurality of IC dice formed on the first wafer with a plurality of IC dice formed on the second wafer, and cutting the stacked first and second wafers to separate a first stacked IC device from a plurality of stacked IC devices. The first stacked IC device separated from the plurality of stacked IC devices has at least a first die from the plurality of IC dice formed on the first wafer and at least a second die from the plurality of IC dice formed on the second wafer.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
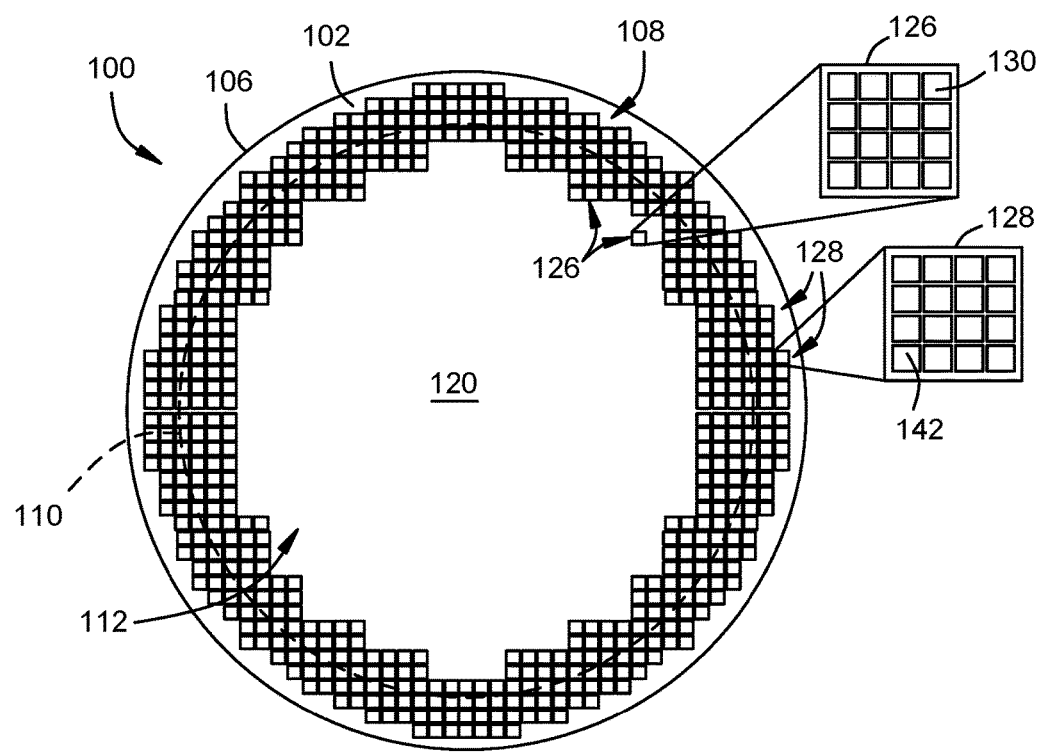
FIGS. 1A-B are plan views of an upper wafer and a lower wafer prior to being stacked to form a wafer on wafer package.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Embodiments herein describe techniques for wafer to wafer stacking of integrated circuit chips. In particular, the techniques disclosed herein significantly reduce the incidence of electrostatic discharge between wafers when the wafers first touch during stacking, thus substantially reducing the probability of damage to dice, and consequently, advantageously increasing product yield of the integrated circuit devices having stacked dice separated from the stacked wafers. The techniques described herein also utilize one or more sacrificial conductive bridges that preferentially connect dice within the exclusion zones of the wafers prior to the dice within an active zone of the wafers being close enough to arc should there be a substantial charge present in the active zone. The dice are connected between wafers in the exclusion zone in a manner that allows at least one of an electrical potential present on each wafer to equalize, and/or grounds the wafers either to an external ground source or to the grounding structures within at least one of the wafers.

FIGS. 1A and 2B are a plan views of two wafers 102, 104 prior to being stacked to form a wafer on wafer (WoW) package 100. The WoW package 100, or stacked die packages cut therefrom, may also be referred to as stacked IC devices. The first wafer 102 includes a first plurality of integrated circuit (IC) dice 126 and a second plurality of IC dice 128 formed on a die side 120 of the first wafer 102. The first plurality of IC dice 126 are formed in an active zone 112 of the first wafer 102, while the second plurality of IC dice 128 are formed in an exclusion zone 108 of the first wafer 102. Although not illustrated in FIG. 1A, the first plurality of IC dice 126 generally extends completely across the active zone 112 of the first wafer 102. The exclusion zone 108 is defined at an outer edge 106 of the first wafer 102. The exclusion zone 108 surrounds the active zone 112 as illustratively shown by dashed boundary line 110. Currently, the industry standard for the width from the edge 106 for the exclusion zone 108 is about 3 mm, although the width of the exclusion zone 108 can be varied as desired. During processing, dice 128 in the exclusion zone 108 often are not properly formed. Thus, stacked packages separated from the WoW package 100 that contain dice 128 from the exclusion zone 108 may be discarded as dice 128 often will not have good performance.

The first plurality of IC dice 126 may be programmable logic devices, such as field programmable gate arrays (FPGA), memory devices, mems devices, optical devices, processors or other IC logic structures. Optical devices include photo-detectors, lasers, optical sources, and the like. The second plurality of IC dice 128 are generally the same as the first plurality of IC dice 126, although some or all of the second plurality of IC dice 128 may be different than the first plurality of IC dice 126.

The exposed surface of each IC die 126 disposed in the active zone 112 includes a plurality of contact pads 130. The contact pads 130 are conductive terminations of circuitry with the die 126 that provide one of ground, power or data communications. The contact pads 130 may optionally include solder bumps (not shown) to facilitate ground, power and signal transmission with the die on the second wafer 104, as further discussed below.

Similarly, the exposed surface of each IC die 128 disposed in the exclusion zone 108 includes a plurality of contact pads 142. The contact pads 142 are conductive terminations of circuitry with the die 128 that provide one of ground, power or data communications.

The second wafer 104 may be constructed identically to the first wafer 102. Alternatively, one or both of the first and second wafers 102, 104 may be a reconstituted wafer. A reconstituted wafer is a wafer made of previously separated dice that are rejoined to form the reconstituted wafer. The dice of the reconstituted wafer generally have been tested to remove underperforming dice such that the stacked package will more likely have a higher stacked IC device yield as opposed to utilized two non-reconstituted wafers.

Figure 1B:
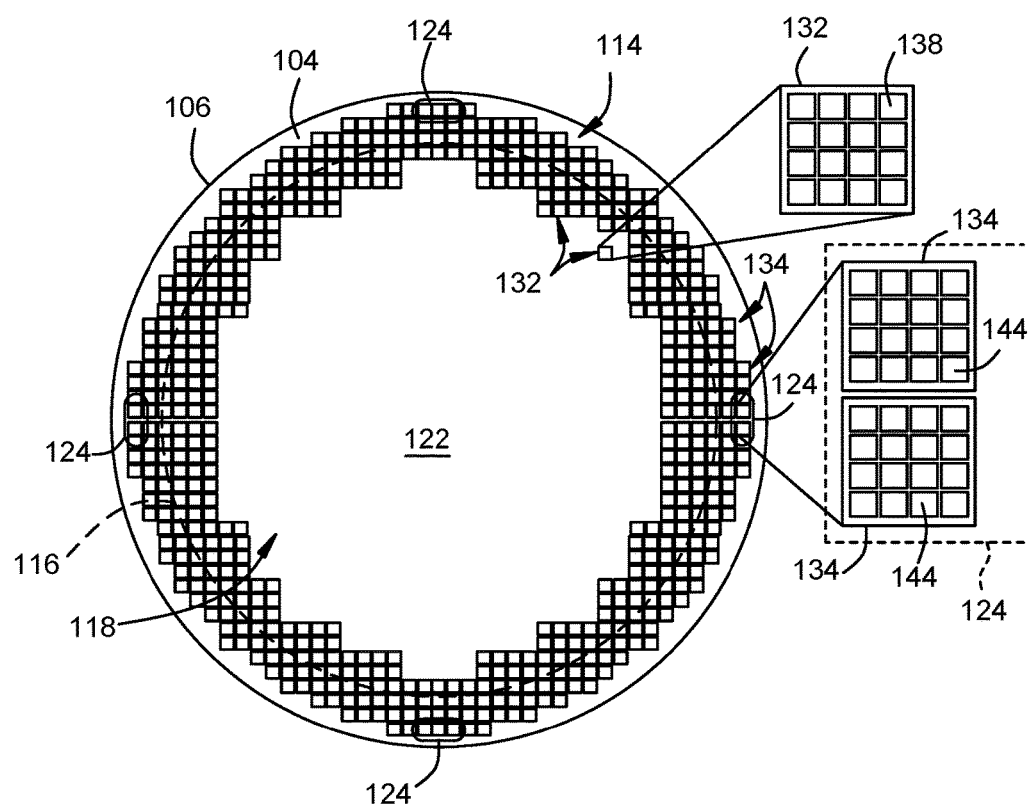

The second wafer 104 includes a first plurality of IC dice 132 and a second plurality of IC dice 134 formed on a die side 122 of the second wafer 104. The first plurality of IC dice 132 are formed in an active zone 118 of the second wafer 104, while the second plurality of IC dice 134 are formed in an exclusion zone 114 defined proximate an outer edge 106 of the second wafer 104. Although not illustrated in FIG. 1B, the first plurality of IC dice 132 generally extends completely across the active zone 118 of the second wafer 104. The exclusion zone 114 surrounds the active zone 118 as illustratively shown by dashed boundary line 116. The width from the edge 106 for the exclusion zone 114 of the second wafer 104 is generally the same as the width of the exclusion zone 108 of the first wafer 102.

The first plurality of IC dice 132 may be programmable logic devices, such as field programmable gate arrays (FPGA), memory devices, mems devices, optical devices, processors or other IC logic structures. Optical devices include photo-detectors, lasers, optical sources, and the like. The first plurality of IC dice 132 formed on the second wafer 104 are generally the same as the first plurality of IC dice 126 formed on the first wafer 102, although some or all of the first plurality of IC dice 132 may be different than the first plurality of IC dice 132 and/or the second plurality of IC dice 134.

The exposed surface of each IC die 132 disposed in the active zone 118 includes a plurality of contact pads 138. The contact pads 138 are conductive terminations of circuitry with the die 132 that provide one of ground, power or data communications. The contact pads 138 may optionally include solder bumps (not shown) to facilitate ground, power and signal transmission with the contact pads 130 of the dice 126 on the first wafer 102, as further discussed below. Similarly, the exposed surface of each IC die 134 disposed in the exclusion zone 114 includes a plurality of contact pads 144.

At least one conductive bridge 124 is disposed on at least one of the first and second wafers 102, 104. For example, as single conductive bridge 124 may be disposed in the exclusion zones 108, 114 of at least one of the first and second wafers 102, 104. One example of a single conductive bridge 124 may be in the form of a ring that circumscribes the active zone 118. Alternatively, a plurality of conductive bridges 124 are may be disposed in the exclusion zones 108, 114 of at least one of the first and second wafers 102, 104. In the example depicted in FIG. 1B, a plurality of conductive bridges 124 are disposed on the second wafer 104 in an angularly spaced apart relation, such as at about every 90 degrees, although other spacing is contemplated. The spaced conductive bridges 124 ensure that if the first wafer 102 is included at an angle relative to the second wafer 104 (i.e., non-parallel), the first wafer 102 will contact one of the conductive bridges 124 to ensure discharge to ground or charge equalization between the wafers 102, 104.

The conductive bridge 124 is generally fabricated from an electrically conductive material. In one example, the conductive bridge 124 is fabricated from an oxidation resistant, conductive material. Materials suitable for fabricating the conductive bridge 124 include gold, silver and graphene, among other conductive materials. In one example, the conductive bridge 124 is a foil having a thickness of about 10 um.

In one example, the conductive bridge 124 has an area greater than or equal to the area of at least one die, and may cover multiple dice. As such, the conductive bridge 124 shorts the conductive pads that are in electrical contact with the bridge 124. In other examples, the area of the conductive bridge 124 is substantially large enough to short a plurality of the conductive pads of a die in contact with the conductive bridge 124. The conductive bridge 124 is disposed only in the exclusion zones 108, 114 of the wafers 102, 104 so as not to short the conductive pads of the dice in the active zones 112, 118. In the example depicted in FIG. 1B, each conductive bridge 124 is disposed over two adjacent dice 134 located in the exclusion zone 114 of the second wafer 104, thus electrically coupling the shorting the pads 144 exposed on the dice 134. Since the pads 144 exposed on the dice 134 are shorted, the conductive bridge 124 is electrically coupled to the grounding scheme of the dice 134 in contact with the bridge 124.

The conductive bridge 124 may be disposed on the second wafer 104 in any suitable manner. For example, the conductive bridge 124 may be a foil that is adhered to or otherwise held over the second wafer 104 such that the conductive bridge 124 becomes sandwiched between the exclusion zones 108, 114 of the wafers 102, 104 when the wafers 102, 104 are stacked. In another example, the conductive bridge 124 may be printed, sprayed, plated or other deposited on the second wafer 104. Although the conductive bridge 124 may be fabricated as part of the die fabrication, the conductive bridge 124 is more easily disposed on the second wafer 104 as part of the packaging process rather than part of a vacuum semiconductor processing technique utilized for die formation.

The conductive bridge 124 projects farther from the die side 122 of the second wafer 104 to ensure that the first wafer 102 contacts the conductive bridge 124 prior to the dice 126, 132 in the active zones 112, 118 coming close enough to potentially arc when the wafers 102, 104 are stacked. Thus, the conductive bridge 124 projects farther from the die side 122 of the second wafer 104 than other structures, but not so far as to inhibit the electrical connection between dice 126, 132 disposed in the active zones 112, 118 of the wafers 102, 104.

Figure 2:
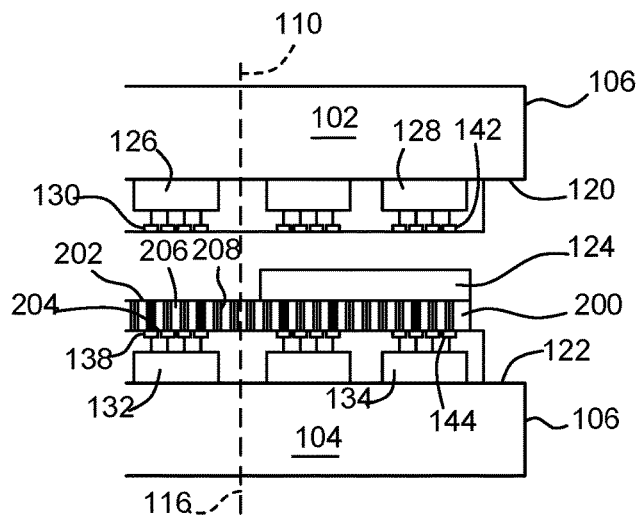
FIGS. 2-4 are a sequence of partial sectional views illustrating of two wafers being stacked to form a wafer on wafer package.
Figure 3:
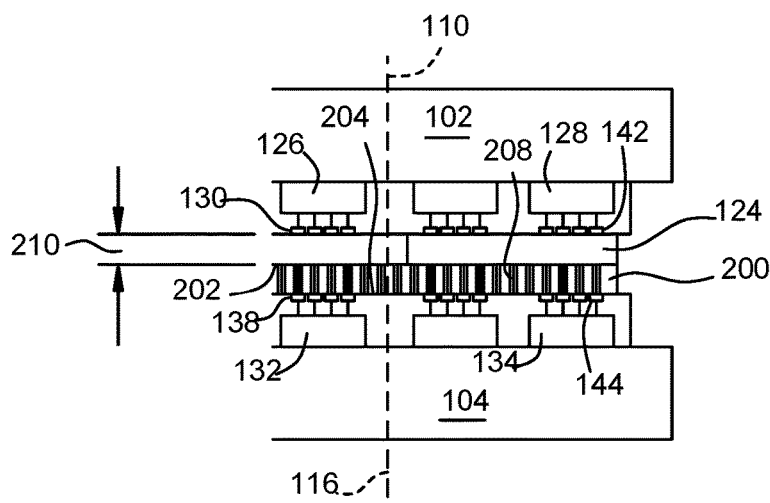

FIGS. 2-3 are a sequence of partial sectional views illustrating of the first and second wafers 102, 104 being stacked to form the WoW package 100. Referring first to FIG. 2, the wafers 102, 104 are position such that the die sides 120, 122 of the wafers 102, 104 are facing each other. The conductive bridge 124 is disposed in the exclusion zone 114 of the second wafer 104 such that the conductive bridge 124 shorts the exposed pads 144 of adjacent dice 134.

The conductive bridge 124 may be disposed directly on the pads 144. Alternatively, and as depicted in FIG. 2, the conductive bridge 124 may be disposed on either side of an adhesion layer 200 that substantially covers the die side 120 of the second wafer 104. As illustrated in FIG. 2, the conductive bridge 124 extends farthest from the second wafer 104 than any other structure formed on the second wafer 104, and is closest to the first wafer 102 as the first wafer 102 is moved toward the second wafer 104 for stacking.

The adhesion layer 200 utilized to couple the first wafer 102 to the second wafer 104 includes a plurality of micro-sized conductive fibers 208 disposed in a non-conductive adhesive material 206. The non-conductive adhesive material 206 is suitable for securing the first wafer 102 to the second wafer 104 once the wafers 102, 104 are pressed in contact with each other. The conductive fibers 208 are arranged in a substantially parallel orientation, such that the conductive fibers 208 extend from a second surface 204 of the adhesion layer 200 that is disposed on the die side 122 of the second wafer 104 to a first surface 202 of the adhesion layer 200 that faces the die side 120 of the first wafer 102. The substantially parallel orientation of the conductive fibers 208 promotes electrical conduction between the first and second surfaces 202, 204 of the adhesion layer 200, while substantially preventing electrical conduction through the adhesion layer 200 in a direction parallel with the surfaces 202, 204 due to the non-conductive adhesive material 206 disposed between the fibers 208. This allows the adhesion layer 200 to preferentially couple conductive pads that are directly across the adhesion layer 200 without electrically connecting laterally disposed pads.

As illustrated in FIG. 3, the conductive bridge 124 extends farthest from the second wafer 104 so that the conductive bridge 124 contacts the exposed conductive pads 142 of the second dice 128 while the dice 126, 132 in the active zones 112, 118 of the wafers 102, 104 remain spaced apart by a distance 210. The distance 210 is sufficient to substantially prevent arcing between the dice 126, 132 in the active zones 112, 118 of the wafers 102, 104.

The exposed pads 144 of the second dice 134 are in contact with the ends of the conductive fibers 208 exposed on the second surface 204 of the adhesion layer 200. The opposite ends of the conductive fibers 208 exposed on the first surface 202 of the adhesion layer 200 are in conductive contact with the conductive bridge 124. The conductive bridge 124 is in electrical contact with the exposed pads 142 of the second dice 128. As the conductive bridge 124 has an area larger than the area of the second die 128, the conductive bridge 124 also shorts the exposed pads 142 of the second dice 128, coupling the conductive bridge 124 to the grounding scheme of the second dice 128. Thus, the conductive bridge 124 couples the shorted pads 142 of the second dice 128 disposed in the exclusion zone 108 of the first wafer 102 to the shorted pads 144 of the second dice 134 disposed in the exclusion zone 114 of the second wafer 104. Accordingly, the conductive bridge 124 couples the grounding scheme of the second dice 128 of the first wafer 102 to the grounding scheme of the second dice 134 of the second wafer 104 while the dice 126, 132 in the active zones 112, 118 remain spaced by the distance 210. As described above, the distance 210 is generally sufficient to prevent arcing between the dice 126, 132 in the active zones 112, 118. As the charges on the adjacent wafers 102, 104 are discharge through the grounding schemes or at least equalized across the conductive bridge 124, the wafers 102, 104 may be further pressed together to electrically connect the pads 130, 138 of the dice 126, 132 within the active zones 112, 118 with significant reduction or even elimination of the risk of arcing between the dice 126, 132.

Figure 4:
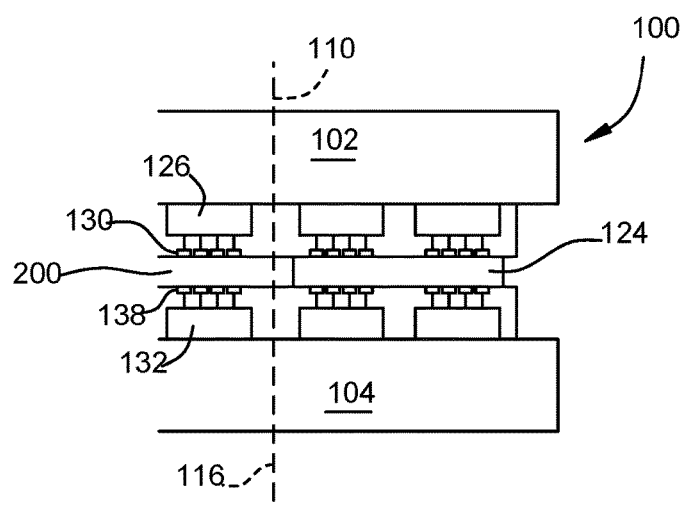

FIG. 4 illustrates the wafers 102, 104 pressed together to form the WoW package 100. Generally, the adhesive material 206 (and/or conductive bridge 124) is compressible enough such that the combined compressed thickness of the adhesion layer 200 and conductive bridge 124 is substantially equal to the thickness of the adhesion layer 200 between the active zones 112, 118 of the wafers 102, 104 to ensure good electrical connection between the pads 130, 138 of the dice 126, 132.

After stacking the wafers 102, 104, the WoW package 100 may be processed (i.e., cut) to separate the one or more stacked die 126, 132 in the active zones 112, 118 from other stacked die 126, 132 in the active zones 112, 118 to form stacked IC device packages. In one example, the stacked IC device packages are separated using a wire saw. The stacked die 128, 134 in the exclusion zones 108, 114, including the stacked dice 128, 134 having the conductive bridge 124 sandwiched therebetween, may be discarded.

Figure 5:
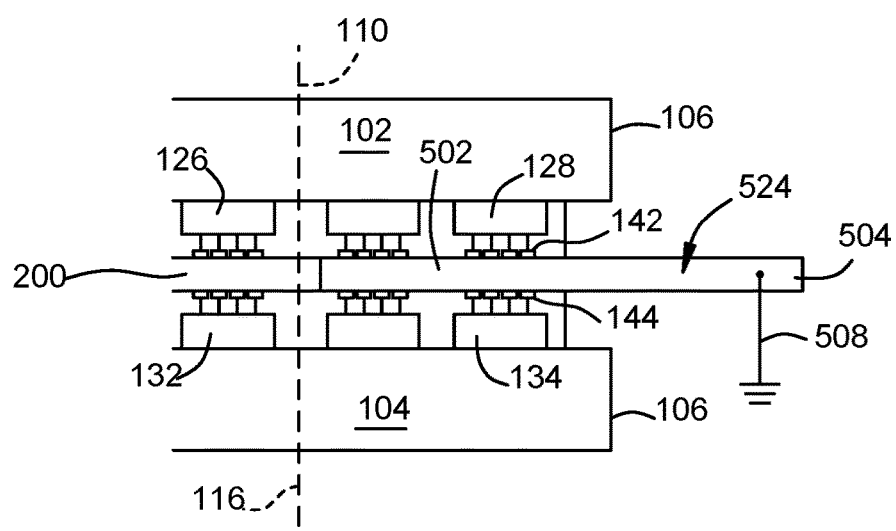
FIG. 5 is an alternative partial sectional view illustrating two wafers stacked to form a wafer on wafer package.

FIG. 5 is a partial sectional view illustrating first and second wafers 102, 104 stacked to form a WoW package 500. The WoW package 500 is formed essentially identical to the WoW package 100 described above, except that at least one conductive bridge 524 extends beyond an edge 106 of the wafer 104.

For example, a first end 502 of the conductive bridge 524 is sandwiched between the first and second wafers 102, 104. The first end 502 of the conductive bridge 524 thus electrically connects the exposed pads 142, 144 of the dice 128, 134 disposed in the exclusion zones 108, 114. A second end 504 of the conductive bridge 524 extends beyond the edge 106 of the first and second wafers 102, 104. The second end 504 of the conductive bridge 524 is coupled to an electrical ground 508. Thus, as the first wafer 102 comes into contact with conductive bridge 524, the first and second wafers 102, 14 are grounded prior to the pads 130, 138 of the dice 126, 132 disposed in the active zones 112, 118 becoming close enough to discharge due to accumulated charge.

Although FIGS. 2-5 illustrate the use of a conductive layer 200 to couple the wafers 102, 104, other wafer bonding techniques may alternative be utilized. For example, the pads 130, 138 may be coupled via solder bump and reflow, acid bonding, and pressure bonding among other techniques. In all the alternative wafer bonding techniques, the conductive bridge 124, 524 is still configured to project farthest from the die side 122 of the second wafer 104 so that the first wafer 102 preferentially contacts the conductive bridge 124, 524 prior to the dice 126, 132 within the active zones 112, 118 becoming close enough to arc.

Figure 6:
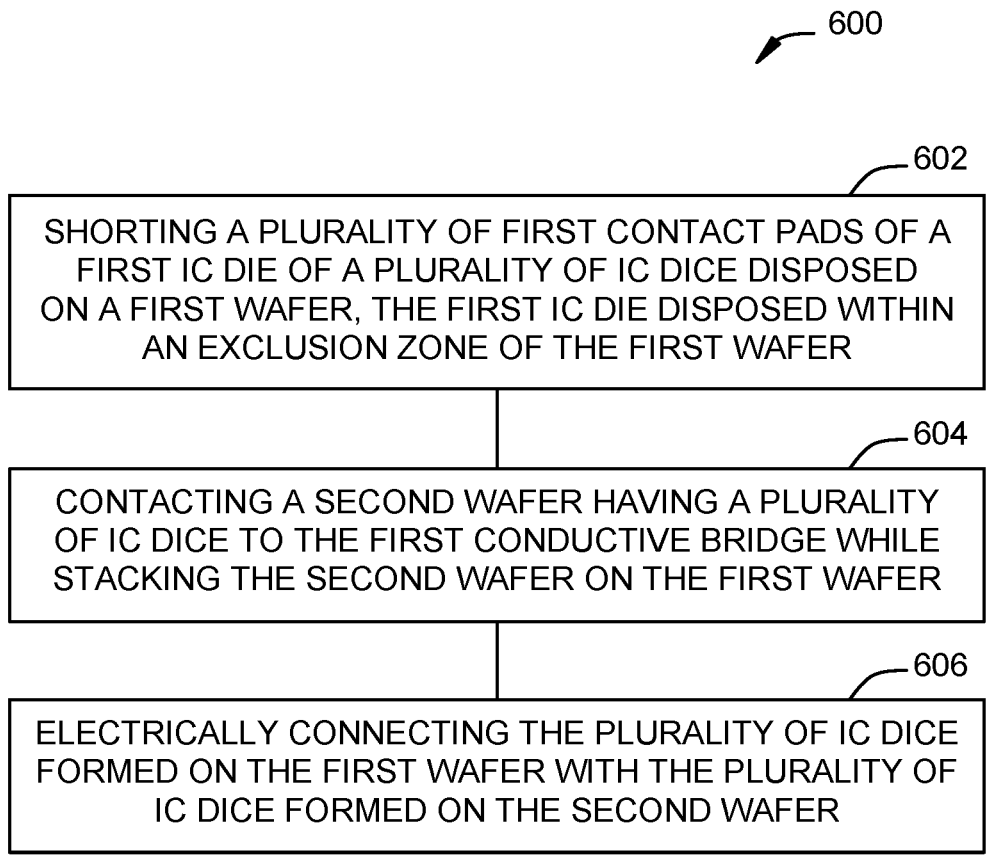
FIG. 6 is a flow diagram of one example of a method for forming a wafer on wafer package.

FIG. 6 is a flow diagram of one example of a method 600 for forming a wafer on wafer package. The method 600 begins at operation 602 by shorting a plurality of first contact pads of a first IC die of a plurality of IC dice disposed on a first wafer utilizing a conductive bridge. The first IC die and the conductive bridge are disposed within an exclusion zone of the first wafer.

At operation 604, a second wafer having a plurality of IC dice are contacted to the first conductive bridge while stacking the second wafer on the first wafer. The wafers may be stacked by flipping the first wafer onto the second wafer, or lowering the first wafer towards the second in a parallel or non-parallel orientation. Contacting the second wafer to the first conductive bridge will equalize the electrical potential of the die side surfaces of the first and second wafers. In some embodiments, the contacting the second wafer to the first conductive bridge will couple the conductive bridge to the ground schemes of at least the first die disposed in the exclusion zone of the first wafer. Optionally, the conductive bridge may include an end that extends laterally beyond an edge of the second wafer where the end can be grounded to an external ground source.

At operation 606, the plurality of IC dice formed on an active area of the first wafer are electrically connected with the plurality of IC dice formed on an active area of the second wafer. The dice within the active areas of the first and second wafers are electrically connected after the first wafer contacts the conductive bridge to reduce the risk of arcing, thereby increasing product yield.

After the wafers are stacked, the stacked dice (i.e., a stack comprising at least one die from each wafer) within the active zone are separated but cutting the wafers, for example, with a wire saw, to form a plurality of individual stacked IC devices.

Figure 7:
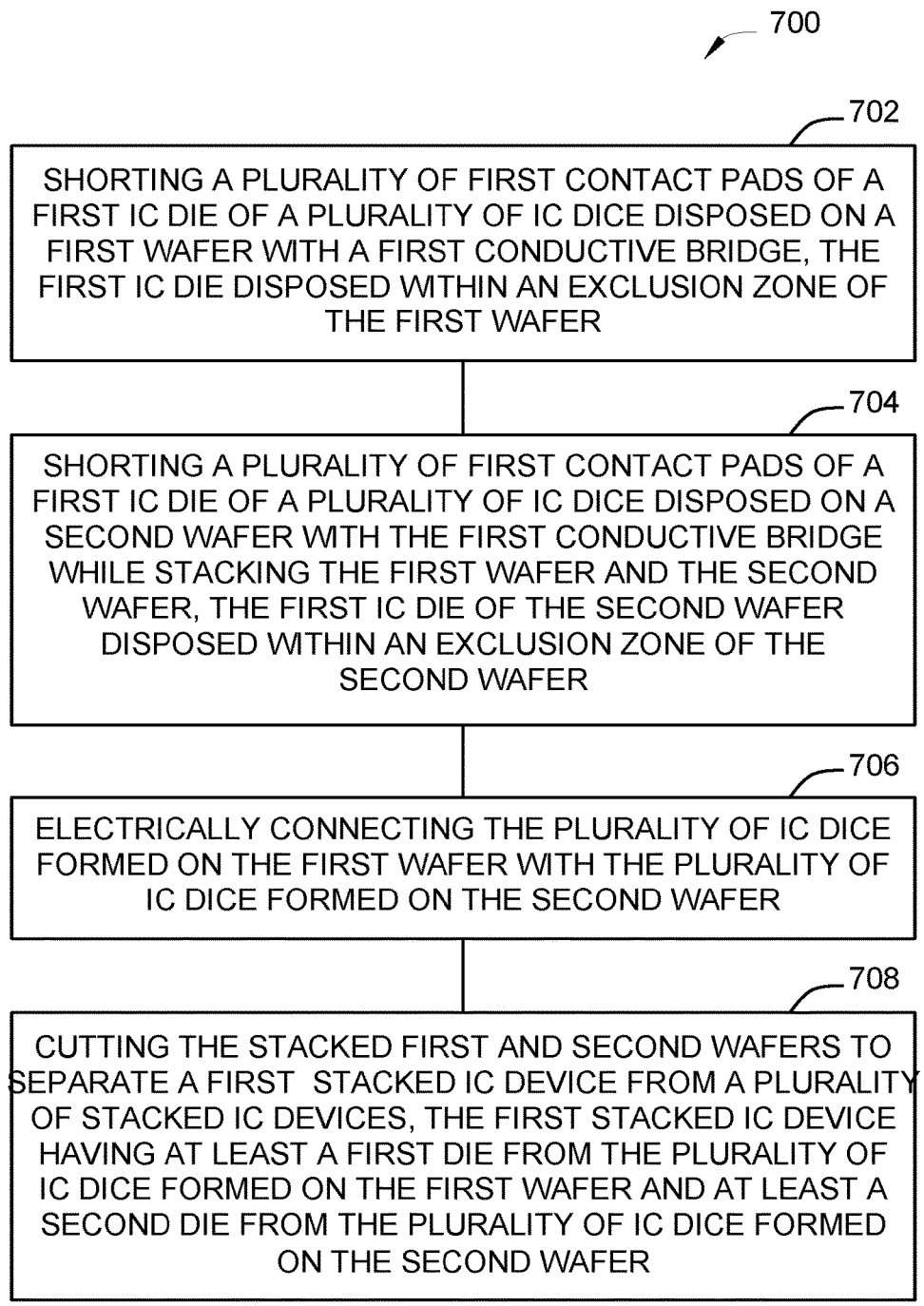
FIG. 7 is a flow diagram of another example of a method for forming a wafer on wafer package.

FIG. 7 is a flow diagram of another example of a method 700 for forming a wafer on wafer package. The method 700 begins at operation 702 by shorting a plurality of first contact pads of a first IC die of a plurality of IC dice disposed on a first wafer with a first conductive bridge. The first IC die is disposed within an exclusion zone of the first wafer.

At operation 704, a plurality of first contact pads of a first IC die of a plurality of IC dice disposed on a second wafer are electrically connected with the first conductive bridge while stacking the first wafer and the second wafer. The first IC die of the second wafer is disposed within an exclusion zone of the second wafer.

At operation 706, dice included in the plurality of IC dice formed on the first wafer outside of the exclusion zone are electrically connected with dice included the plurality of IC dice formed on the second wafer outside of the exclusion zone. At operation 708, the stacked first and second wafers are cut to separate a first stacked IC device from a plurality of stacked IC devices, for example, by use of a wire saw. The first stacked IC device has at least a first die from the dice formed on the first wafer outside of the exclusion zone and at least a second die from the dice formed on the second wafer outside of the exclusion zone. As the dice in the exclusion zones are coupled prior to coupling the dice inward of the exclusion zone, the risk of discharge and arcing is significantly reduced.

While the foregoing is directed to specific examples, other and further examples may be devised without departing from the basic scope thereof, and the scope thereof is determined by the claims that follow.

What is claimed is:

1. A stacked integrated circuit (IC) device, comprising:
   a first wafer having a first plurality of integrated circuit (IC) dice disposed inward of an exclusion zone located at an edge of the first wafer and a second plurality of IC dice disposed within the exclusion zone;
   a second wafer stacked on and secured to the first wafer, the second wafer having a first plurality of IC dice disposed inward of an exclusion zone of the second wafer and a second plurality of IC dice disposed within the exclusion zone of the second wafer, the first plurality of IC dice formed on the second wafer communicatively coupled with the first plurality of IC dice formed on the first wafer; and
   a first conductive bridge disposed in the exclusion zones and sandwiched between the first and second wafers, the first conductive bridge shorting a plurality of first contact pads of at least a first IC die of the second plurality of IC dice disposed within the exclusion zone of the first wafer while shorting a plurality of first contact pads of at least a first IC die of the second plurality of IC dice disposed within the exclusion zone of the second wafer.

2. The stacked IC device of claim 1, wherein the first conductive bridge is formed from an oxidation resistant material.

3. The stacked IC device of claim 1, wherein the first conductive bridge further comprises:
   a foil comprised of gold, silver or graphene.

4. The stacked IC device of claim 1, wherein the first conductive bridge circumscribes the first plurality of IC dice formed on the first wafer.

5. The stacked IC device of claim 1 further comprising:
   a plurality of conductive bridges that includes the first conductive bridge, wherein each of the plurality of conductive bridges shorts a plurality of first contact pads of at least one IC die of the second plurality of IC dice disposed within the exclusion zone of the first wafer while shorting a plurality of first contact pads of at least one IC die of the second plurality of IC dice disposed within the exclusion zone of the second wafer.

6. The stacked IC device of claim 5, wherein the first conductive bridge further comprises:
   a first end and a second end, the first end sandwiched between the first and second wafers, the second end extending laterally beyond the edges of the first and second wafers.

7. The stacked IC device of claim 6, wherein the plurality of conductive bridges further comprises:
   a second conductive bridge having a first end and a second end, the first end of the second conductive bridge sandwiched between the first and second wafers, the second end of the second conductive bridge extending laterally beyond the edges of first and second wafers, the second conductive bridge spaced from the first conductive bridge along a perimeter of the first wafer.

8. The stacked IC device of claim 1, wherein the first conductive bridge further comprising:
   a first end sandwiched between the first and second wafers; and
   a second end extending laterally beyond the first and second wafers.

* * * * *